US010218386B1

(12) United States Patent
Langhammer et al.

(10) Patent No.: US 10,218,386 B1
(45) Date of Patent: Feb. 26, 2019

(54) METHODS AND APPARATUS FOR PERFORMING VARIABLE AND BREAKOUT REED SOLOMON ENCODING

(71) Applicant: Intel Corporation, Santa Clara, CA (US)

(72) Inventors: Martin Langhammer, Alderbury (GB); Simon Finn, High Wycombe (GB); Sami Mumtaz, London (GB)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 15/359,548

(22) Filed: Nov. 22, 2016

(51) Int. Cl.
  *H03M 13/00* (2006.01)
  *H03M 13/15* (2006.01)

(52) U.S. Cl.
  CPC ... *H03M 13/1515* (2013.01); *H03M 13/1575* (2013.01); *H03M 13/616* (2013.01)

(58) Field of Classification Search
  CPC ......... H03M 13/1515; H03M 13/1575; H03M 13/616; H03M 13/6516; H03M 13/1555; H03M 13/151; H03M 13/157; H03M 13/1525; H03M 13/611; H03M 13/617
  See application file for complete search history.

(56) References Cited

U.S. PATENT DOCUMENTS

| 4,675,869 A | 6/1987 | Driessen |
| 5,754,563 A | 5/1998 | White |
| 6,275,965 B1 | 8/2001 | Cox et al. |
| 6,378,105 B1 | 4/2002 | Chiang |
| 6,532,566 B1 | 3/2003 | Chiang |
| 6,694,476 B1 | 2/2004 | Sridharan et al. |
| 8,176,397 B2 | 5/2012 | Panteleev |
| 8,347,192 B1 | 1/2013 | Langhammer |
| 8,631,307 B2 * | 1/2014 | Carginini ............ H03M 13/152 714/752 |
| 2003/0063554 A1 * | 4/2003 | Morioka ........... H03M 13/1515 370/200 |
| 2006/0090119 A1 * | 4/2006 | Dong ................ H03M 13/1515 714/784 |
| 2018/0006664 A1 * | 1/2018 | Langhammer ....... H03M 13/611 |

* cited by examiner

*Primary Examiner* — Christine T. Tu
(74) *Attorney, Agent, or Firm* — Treyz Law Group, P.C.; Jason Tsai

(57) ABSTRACT

A Reed-Solomon encoder that supports multiple code words is provided. The encoder circuit may include partial syndrome calculation circuitry, three matrix multiplication circuits, and two adder circuits. The partial syndrome calculation circuitry may receive a message and generate partial syndromes. The first matrix multiplication circuit may multiply a lower portion of the partial syndromes by a small Lagrange matrix to produce a small parity symbol vector. The second matrix multiplication circuit may multiply the small parity symbol vector by a Vandermonde matrix to produce a product vector. The first adder circuit may add the product vector to an upper portion of the partial syndromes to produce a sum vector. The third matrix multiplication circuit may multiply the sum vector by a large Lagrange matrix to produce a large product vector. The large product vector may be selectively combined with the small parity symbol vector to generate final parity check symbols.

20 Claims, 6 Drawing Sheets

METHODS AND APPARATUS FOR PERFORMING VARIABLE AND BREAKOUT REED SOLOMON ENCODING

BACKGROUND

The present embodiments relate to Reed-Solomon encoding, and to circuitry for performing such encoding, particularly on an integrated circuit.

Many modern applications encode data prior to transmission of the data on a network using error-correcting codes such as Reed-Solomon codes. Such codes are capable of providing powerful error correction capability. For example, a Reed-Solomon code of length n and including n–k check symbols may detect any combination of up to 2t=n–k erroneous symbols and correct any combination of up to t symbols.

Most known techniques for Reed-Solomon encoding are based on polynomial division. The direct application of this method allows for calculation of check symbols, which are sometimes also referred to as parity check symbols, based on the input of one data symbol at a time. With k symbols in a message word, k clock cycles are needed to calculate n–k check symbols. By substitution, it may be possible to calculate the check symbols based on the input of a number of data symbols at once, but the feedback nature of such a calculation means that the critical path grows with each additional parallel input symbol, and the encoder operational frequency is decreased quickly.

Moreover, increasing communications, storage, and processing demands require ever more efficient error correction including Reed-Solomon forward error correction (FEC). Consequently, it is desirable to provide improved mechanisms for implementing error correction.

SUMMARY

An integrated circuit may be configured to implement a Reed-Solomon encoder circuit that is operable in at least a first mode that outputs a small code word (e.g., RS(528, 514)) and a second mode that outputs a large code word (e.g., RS(544,514)). The encoder circuit may include a smaller encoder sub-circuit that generates small parity check symbols during both the first and second modes. Operated in this way, both the small and large code word processing share the smaller encoder sub-circuit as long as both are computed in the same base Galois field.

In accordance with an embodiment, the encoder circuit may include partial syndrome calculation circuitry, a first matrix multiplication circuit, a second matrix multiplication circuit, a third matrix multiplication circuit, a first adder circuit, and a second adder circuit. The partial syndrome calculation circuitry may receive message symbols and compute a corresponding partial syndrome vector.

The first matrix multiplication circuit may receive a lower portion of the partial syndrome vector and multiply the lower portion by a small Lagrange matrix to produce a small parity symbol vector. The second matrix multiplication circuit may receive the small parity symbol vector and multiply the small parity symbol vector by a Vandermonde matrix to produce a corresponding product vector.

The first adder circuit may combine the product vector generated by the second matrix multiplication circuit with an upper portion of the partial syndrome vector to produce a corresponding sum vector. The third matrix multiplication circuit may receive the sum vector and multiply the sum vector by a large Lagrange matrix that is bigger than the small Lagrange matrix associated with the first matrix multiplication circuit to produce an output vector.

The second adder circuit may combine a lower portion of the output vector with the small parity symbol vector to produce first parity check symbols. The remaining upper portion of the output vector may serve as second parity check symbols. Only the first parity check symbols are used during the first mode, whereas both the first and second parity check symbols are used during the second mode.

If desired, the Reed-Solomon encoder may be pipelined. Register pipeline circuits may be inserted at the input and output of each matrix multiplication circuit. Moreover, shifting circuitry may be place at the input or output of each matrix multiplication circuit to help synchronize the symbols between the different modes.

Further features of the invention, its nature and various advantages will be more apparent from the accompanying drawings and following detailed description.

DETAILED DESCRIPTION

The present embodiments provided herein relate to Reed-Solomon encoding and to circuitry for performing such encoding, particularly in an integrated circuit.

Many modern applications encode data prior to transmission of the data on a network. As part of the data encoding, error-correcting codes such as Reed-Solomon codes are often included to allow for the detection and/or correction of data signals that were corrupted during the data transmission. Reed-Solomon codes are often used because they provide powerful error correction capabilities.

However, most known techniques for Reed-Solomon encoding are based on polynomial division, and the feedback nature of such techniques implies that the critical path grows with each additional parallel input. As a result, the encoder operational frequency is decreased quickly. At the same time, increasing communications, storage, and processing demands require ever more efficient error correction.

Consequently, it is desirable to provide improved mechanisms of encoding Reed-Solomon code words. For example, it is desirable to provide a Reed-Solomon encoder that can be easily parallelized and have obvious points of inserting pipelining so that the Reed-Solomon encoder can be used in very fast systems (e.g., 100G Ethernet or 400G Ethernet).

In certain embodiments, Reed-Solomon encoding and/or decoding circuitry may be implemented in an integrated circuit that is coupled to a network, as an example.

It will be recognized by one skilled in the art, that the present exemplary embodiments may be practiced without some or all of these specific details. In other instances, well-known operations have not been described in detail in order not to unnecessarily obscure the present embodiments.

Figure 1:
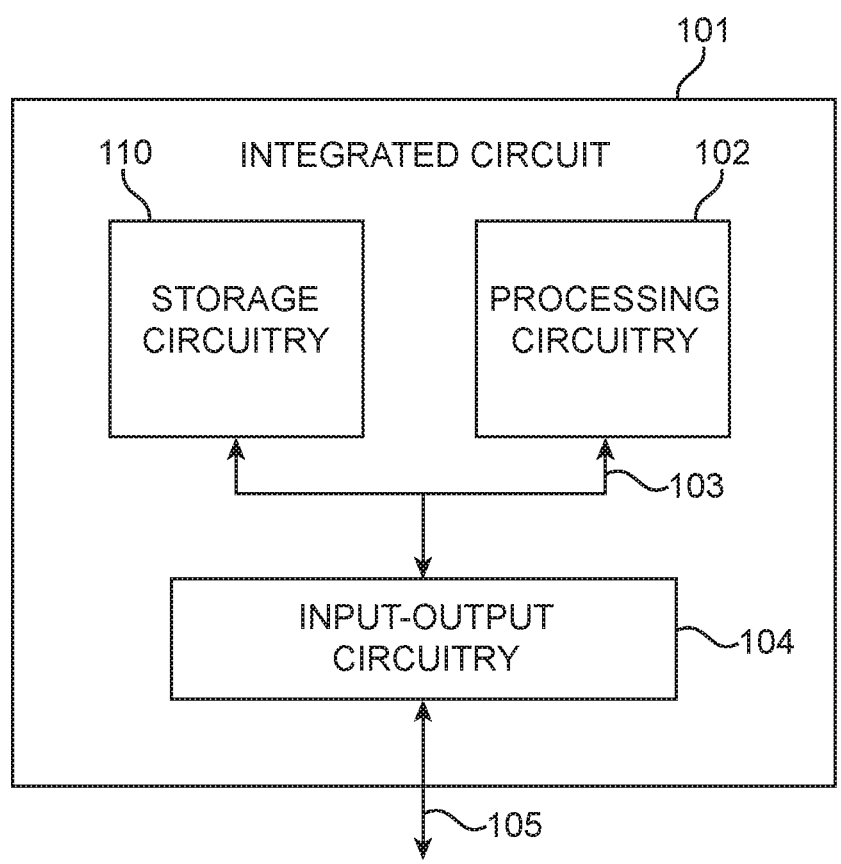
FIG. 1 is a diagram of an illustrative integrated circuit in accordance with an embodiment.

An illustrative embodiment of an integrated circuit 101 is shown in FIG. 1. Integrated circuit 101 may have multiple components. These components may include processing circuitry 102, storage circuitry 110, and input-output circuitry 104. Processing circuitry 102 may include embedded microprocessors, digital signal processors (DSP), microcontrollers, or other processing circuitry.

Storage circuitry 110 may have random-access memory (RAM), read-only memory (ROM), or other addressable memory elements. Storage circuitry 110 may be a single-port memory, a dual-port memory, a quad-port memory, or have any other arbitrary number of ports. If desired, storage circuitry 110 may be implemented as a single-port memory with control circuitry that emulates dual-port, quad-port, or other multi-port behavior. Processing circuitry 102 may access storage circuitry 110 by sending read and/or write requests over interconnection resources 103 to storage circuitry 110. In some embodiments, external components may access storage circuitry 110 via external interconnection resources 105, input-output circuitry 104, and interconnection resources 103. In response to receiving a read request, storage circuitry 110 may retrieve the requested data and send the retrieved data over interconnection resources 103 to the requestor. In case of a write request, storage circuitry 110 may store the received data.

Internal interconnection resources 103 such as conductive lines and busses may be used to send data from one component to another component or to broadcast data from one component to one or more other components. External interconnection resources 105 such as conductive lines and busses, optical interconnect infrastructure, or wired and wireless networks with optional intermediate switches may be used to communicate with other devices.

Input-output circuitry 104 may include parallel input-output circuitry, differential input-output circuitry, serial data transceiver circuitry, or other input-output circuitry suitable to transmit and receive data. If desired, input-output circuitry 104 may include error detection and/or error correction circuitry. For example, input-output circuitry 104 may include Reed-Solomon encoding and/or decoding circuitry that encode data signals by creating Reed-Solomon code words based on the data signals before the data transmission or decode Reed-Solomon code words after the data reception to allow for error correction and reconstitution of the data signals.

Figure 2:
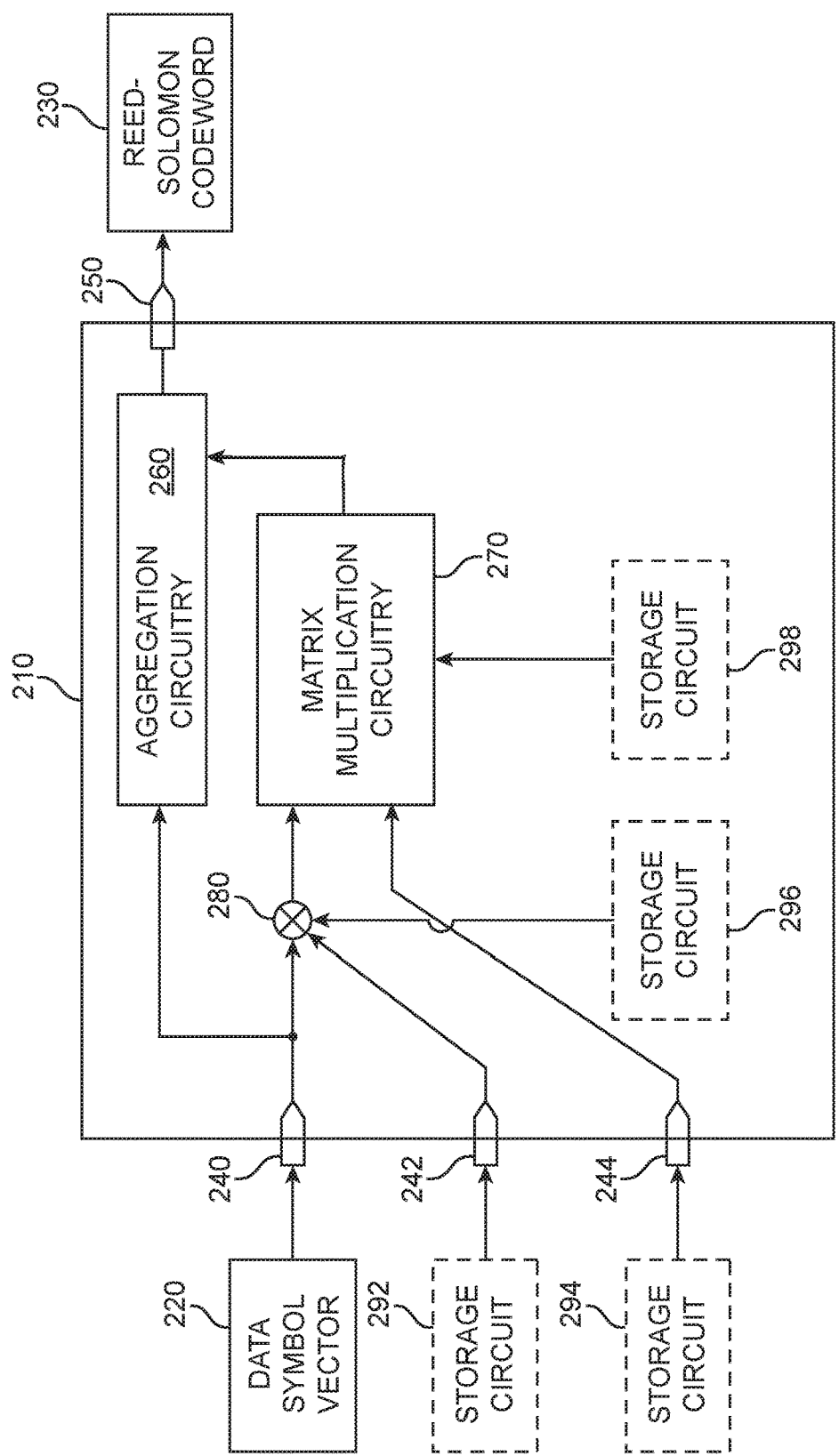
FIG. 2 is a diagram of an illustrative Reed-Solomon encoder circuit in accordance with an embodiment.

FIG. 2 illustrates such a Reed-Solomon encoder circuit such as encoder 210. As shown in FIG. 2, Reed-Solomon encoder circuit 210 may include input ports 240, 242, and 244, output port 250, multiplier 280, matrix multiplication circuit 270, aggregation circuitry 260, and optional storage circuits 296 and 298.

Reed-Solomon encoder circuit 210 may receive a data symbol vector m (220 in FIG. 2), which is sometimes also referred to as a message, at input port 240 and provide a Reed-Solomon code word c (230 in FIG. 2) at output port 250. As an example, data symbol vector m may have k symbols, and Reed-Solomon code word c may have n symbols, where n>k. The n-symbol Reed-Solomon code word 230 may include 2t=n−k parity check symbols p that allow for the detection of up to 2t erroneous symbols and the correction of up to t symbols. The lower-case notation m, c, and p may be used when referring to the message, code word, and parity symbols, respectively, as vectors. In contrast, the upper-case notation M(X), C(X), and P(X) may be used when treating them as polynomials, where each individual vector element then becomes a polynomial coefficient.

Reed-Solomon encoding operates over a finite field, and the n-symbol Reed-Solomon code word 230 may be defined as:

$$C(X)=X^{(n-k)}M(X)+P(X) \quad (1)$$

where $X^{(n-k)}$ shifts data symbol vector m such that the data symbol vector m doesn't overlap with the parity check symbols p.

The Reed-Solomon code word 230 may be transmitted over a connection and received by a Reed-Solomon decoder circuit as a word r that has n symbols. Word r may include error word e in addition to Reed-Solomon code word c (i.e., r=c+e). The Reed-Solomon decoder circuit may check the word r to detect and correct the error with the goal of restoring the message. For example, the Reed-Solomon decoder circuit may compute a syndrome vector syn for the received word using a parity check matrix S, which may have n rows and 2t=(n−k) columns:

$$syn=r*S=c*S+e*S \quad (2)$$

Consider the scenario in which the word r is received without an error (i.e., e=0 and r=c). In this scenario, equation 2 is equal to zero (i.e., syn=c*S=0), because S is the parity check matrix of the Reed-Solomon code and the Reed-Solomon code word c evaluated at any root is zero.

Thus, if desired, the Reed-Solomon encoder circuit 210 may use the parity check matrix for the encoding and derive the parity check symbols so that the produced code word is orthogonal to the parity check matrix. In this scenario, the Reed-Solomon encoding problem may be stated as a matrix problem in the form:

$$m*S_u+p*S_d=0 \quad (3)$$

where m is the k-symbol message, p is the (n−k) parity check symbols, $S_u$ includes the first k rows of S, $S_d$ the last (n−k) rows of S. For example, matrices $S_u$ and $S_d$ may be defined as:

$$S_u = \begin{bmatrix} \alpha^{(n-k-1)(n-1)} & \cdots & \alpha^{n-1}, \alpha^0 \\ \vdots & \ddots & \vdots \\ \alpha^{(n-k-1)(n-k)} & \cdots & \alpha^{n-k}, \alpha^0 \end{bmatrix} \quad (4)$$

and $$S_d = \begin{bmatrix} \alpha^{(n-k-1)^2} & \cdots & \alpha^{n-k-1}, \alpha^0 \\ \vdots & \ddots & \vdots \\ \alpha^0 & \cdots & \alpha^0, \alpha^0 \end{bmatrix} \quad (5)$$

Matrices $S_u$ and $S_d$ may be computed using the generator polynomial of the finite field, which may be sometimes also referred to as the field polynomial. The field polynomial is usually provided by an industry standard. For example, the 100G Ethernet standard IEEE 802.3bj defines a Reed-Solomon code with n=528, k=514, t=14, and a field polynomial $X^{10}+X^3+1$.

Thus, all elements in matrices $S_u$ and $S_d$ may be computed once. If desired, matrices $S_u$ and $S_d$ may be stored in storage circuits. For example, Reed-Solomon encoder circuit 210 may include storage circuits 296 and 298 to store matrices $S_u$ and $S_d$, respectively. If desired, storage circuits 292 and 294 outside Reed-Solomon encoder circuit 210 may store matrices $S_u$ and $S_d$, respectively, and Reed-Solomon encoder circuit 210 may receive the matrices at input ports 242 and 244, respectively. In some scenarios, one matrix of matrices $S_u$ and $S_d$ may be stored inside Reed-Solomon encoder circuit 210 and the other matrix may be stored outside Reed-Solomon encoder circuit 210.

Reed-Solomon encoder circuit 210 may receive message m as data symbol vector 220 at input port 240. Multiplier 280 may multiply message m with matrix $S_u$ to determine a partial syndrome vector v (i.e., $v=m*S_u$). Multiplier 280 can therefore sometimes be referred to as a partial syndrome generator. For example, multiplier 280 may perform a syndrome calculation on the message and continue the syndrome calculation with zeroes inserted where the unknown parity symbols would be. In another example, multiplier 280 may perform a syndrome calculation on the message, stop the syndrome calculation after the last message symbol, and frequency shift the partially computed syndrome in the frequency domain by multiplying the partially computed syndrome with a set of constants.

At this point, a numerical method is introduced to calculate parity check symbols p. This problem can be summarized as a solution of $xA=-b$, where A is matrix $S_d$, x is the row vector p, and b is the row vector of partial syndromes $m*S_u$. By inspection, $S_d$ is a Vandermonde matrix, which is an invertible matrix. Thus, the parity check symbols p may be computed as follows:

$$p*S_d*S_d^{-1}=-m*S_u*S_d^{-1} \qquad (6)$$

Since $S_d*S_d^{-1}$ is equal to one, $-m$ is equal to m in any extension of the binary field GF(2) and v is equal to $m*S_u$, equation 6 simplifies to:

$$p=v*S_d^{-1} \qquad (7)$$

In accordance with an embodiment, the solution to equation 7 can be found using Lagrangian polynomials. The required vector p corresponds to a certain polynomial $P(X)$:

$$P(X) \triangleq \sum_{i=0}^{n-k-1} p_i X^i \qquad (8)$$

where the coefficients $\{p_i\}$ of $P(X)$ are the elements of the vector p. Suitable values for these coefficients can be calculated using Lagrangian interpolation:

$$P(X)=\Sigma_{i=0}^{n-k-1} v_j L_j(X) \qquad (9)$$

Where:

$$L_j(X) = \prod_{i=0, i \neq j}^{n-k-1} \frac{X-\alpha_i}{\alpha_j - \alpha_i} \qquad (10)$$

$\{v_j\}$ are the coefficients of the partial syndrome obtained by computing $v=m*S_u$. In the following we verify that the coefficients $\{p_i\}$ are actually the parity check symbols satisfying equation 7. Note that $L_j(\alpha^j)=1$ while $L_j(\alpha^i)=0$ if $i \neq j$. This means that:

$$P(\alpha^j)=v_j \qquad (11)$$

where equation 11 holds for any j in 0 ... n−k−1. Combining equation 8 with equation 11 gives:

$$P(\alpha^j)=\Sigma_{i=0}^{n-k-1} p_i \alpha^{ji} = v_j \qquad (12)$$

However, $\Sigma_{i=0}^{n-k-1} p_i \alpha^{ji}$ is precisely the $j^{th}$ element of the vector $p*S_d$. This means that:

$$\{p*S_d\}_j=v_j \qquad (13)$$

Since equation 13 holds for all j in 0 ... n−k−1 (i.e. for all rows of the vector), we get:

$$p*S_d=v \qquad (14)$$

Since $S_d$ is invertible, we also get:

$$p=v*S_d^{-1} \qquad (15)$$

as required by equation 7.

As a simple example with (n−k)=3, the polynomial can be expanded as follows:

$$P(X) = \qquad (16)$$
$$\frac{(X-\alpha)(X-\alpha^2)}{(1-\alpha)(1-\alpha^2)}v_0 + \frac{(X-1)(X-\alpha^2)}{(\alpha-1)(\alpha-\alpha^2)}v_1 + \frac{(X-1)(X-\alpha)}{(\alpha^2-\alpha)(\alpha^2-1)}v_2$$

The coefficients for each $v_j$ remains constant (since $\alpha$ is known for a given finite field) and only the syndromes $v_j$ will change with each new message.

As another example, consider a scenario in which a Reed-Solomon code word is defined such that n=30, k=24, and m=8, with field polynomial $X^8+X^4+X^3+X^2+1$. Since (n−k) is equal to six in this example, the corresponding polynomial will have six terms can be expanded as follows:

$$P(X) = \frac{(X-\alpha)(X-\alpha^2)(X-\alpha^3)(X-\alpha^4)(X-\alpha^5)}{(1-\alpha)(1-\alpha^2)(1-\alpha^3)(1-\alpha^4)(1-\alpha^5)}v_0 + \qquad (17)$$
$$\frac{(X-1)(X-\alpha^2)(X-\alpha^3)(X-\alpha^4)(X-\alpha^5)}{(\alpha-1)(\alpha-\alpha^2)(\alpha-\alpha^3)(\alpha-\alpha^4)(\alpha-\alpha^5)}v_1 +$$
$$\frac{(X-1)(X-\alpha)(X-\alpha^3)(X-\alpha^4)(X-\alpha^5)}{(\alpha^2-1)(\alpha^2-\alpha)(\alpha^2-\alpha^3)(\alpha^2-\alpha^4)(\alpha^2-\alpha^5)}v_2 +$$
$$\frac{(X-1)(X-\alpha)(X-\alpha^2)(X-\alpha^4)(X-\alpha^5)}{(\alpha^3-1)(\alpha^3-\alpha)(\alpha^3-\alpha^2)(\alpha^3-\alpha^4)(\alpha^3-\alpha^5)}v_3 +$$
$$\frac{(X-1)(X-\alpha)(X-\alpha^2)(X-\alpha^3)(X-\alpha^5)}{(\alpha^4-1)(\alpha^4-\alpha)(\alpha^4-\alpha^2)(\alpha^4-\alpha^3)(\alpha^4-\alpha^5)}v_4 +$$
$$\frac{(X-1)(X-\alpha)(X-\alpha^2)(X-\alpha^3)(X-\alpha^4)}{(\alpha^5-1)(\alpha^5-\alpha)(\alpha^5-\alpha^2)(\alpha^5-\alpha^3)(\alpha^5-\alpha^4)}v_5$$

Now, consider that an illustrative 24 symbol message contains monotonically decreasing values m={30, 29, 28, . . . , 8, 7} and that the partial syndromes $m*S_u$={115, 192, 21, 217, 192, 24}. In other words, $\{v_0, v_1, v_2, v_3, v_4, v_5\}$ is equal to {24, 192, 217, 21, 192, 115}, respectively.

The roots of the field 1, $\alpha$, $\alpha^2$, $\alpha^3$, $\alpha^4$, and $\alpha^5$ can be calculated from the field polynomial, and are equal to 1, 2, 4, 8, 16, and 32, respectively. Substituting these values into equation 17, the denominator of the first term is equal to 6, and the numerator is:

$$X^5+62X^4+63X^3+229X^2+197X+38 \qquad (18)$$

Thus, the first Lagrange polynomial term (i.e., the coefficient of $v_0$) is equal to:

$$122X^5+254X^4+132X^3+84X^2+175X+250 \qquad (19)$$

Similarly, the second to fifth Lagrange polynomial terms can be computed and are equal to:

$$187X^5+93X^4+X^3+153X^2+209X+175 \qquad (20)$$

$$46X^5+108X^4+131X^3+12X^2+153X+84 \qquad (21)$$

$$133X^5+105X^4+234X^3+131X^2+X+132 \quad (22)$$

$$60X^5+154X^4+105X^3+108X^2+93X+254 \quad (23)$$

$$86X^5+60X^4+133X^3+46X^2+187X+122 \quad (24)$$

Although equations 19-24 seem fairly complicated, they can all be computed in advance since they are constant for any given code word. As a result, calculation of the parity check symbols now becomes a simple matrix multiplication operation based on the Lagrange polynomial terms and the calculated partial syndromes m*$S_u$. Substituting the partial syndromes into equation 17, the parity check symbols can be computed as follows:

$$P(X) \triangleq p_5X^5 + p_4X^4 + p_3X^3 + p_2X^2 + p_1X + p_0 = \quad (25)$$
$$(122X^5 + 254X^4 + 132X^3 + 84X^2 + 175X + 250) * 24 +$$
$$(187X^5 + 93X^4 + X^3 + 153X^2 + 209X + 175) * 192 +$$
$$(46X^5 + 108X^4 + 131X^3 + 12X^2 + 153X + 84) * 217 +$$
$$(133X^5 + 105X^4 + 234X^3 + 131X^2 + X + 132) * 21 +$$
$$(60X^5 + 154X^4 + 105X^3 + 108X^2 + 93X + 254) * 192 +$$
$$(86X^5 + 60X^4 + 133X^3 + 46X^2 + 187X + 122) * 115$$

Where $p_5$ is equal to the sums of all the $X^5$ products, which is equal to 116 (=24*122+192*187+ . . . +115*86, e.g., using Galois field arithmetic). Similarly, $p_4$ is equal to the sums of all the $X^4$ products; $p_3$ is equal to the sums of all the $X^3$ products; etc. As a reminder 24=$v_0$, 192=$v_1$, 217=$v_3$, etc. All remaining parity check symbols can be computed in this way.

Aggregation circuit 260 of FIG. 2 may combine the data symbol vector and the parity check symbols, thereby generating Reed-Solomon code word 230, and provide Reed-Solomon code word 230 at output port 250 of Reed-Solomon encoder circuit 210.

Conventional Reed-Solomon encoder circuits are only capable of supporting a fixed-length code word. For example, to support both a first Reed-Solomon encoding RS(528,514) (i.e., an encoding where n=528 and k=514) and a second Reed-Solomon encoding RS(544,514) (i.e., an encoding where n=544 and k=514), two completely separate encoders will have to be constructed. Use of two different encoders to support code words of different lengths is inefficient. It would therefore be desirable to provide a Reed-Solomon encoder 210 that is capable of supporting variable encoding.

In accordance with an embodiment, Reed-Solomon encoder circuit 210 may be capable of supporting variable code word lengths. Referring back to the example of equation 25, the parity check symbols can be computed by multiplying the Lagrangian polynomials by the partial syndromes. The Lagrangian polynomials (i.e., the 36 total coefficients shown in equations 19-24) may be represented as a 6-by-6 Lagrange matrix $L_{6\times6}$. This example where matrix $L_{6\times6}$ is generated for a scenario in which (n−k) is equal to six is merely illustrative. The techniques described above may be used to generate Lagrange matrices for any code word length.

For example, to support RS(528,514), where (n−k) is equal to 14, a "small" Lagrange matrix $L_{14\times14}$ may be generated. Similarly, to support RS(544,514), where (n−k) is equal to 30, a "large" Lagrange matrix $L_{30\times30}$ may be generated. By definition, an N-by-N Lagrange matrix is equal to the inverse of the Vandermonde matrix:

$$L_{N\times N}=V_N^{-1} \quad (26)$$

In this disclosure, the inverse of a Vandermonde matrix employing Lagrangian polynomials will be described as a Lagrange or Lagrangian matrix. Thus, the small Lagrange matrix and the large Lagrange matrix may be written as follows:

$$L_{small}=V_{14}^{-1} \quad (27)$$

$$L_{large}=V_{30}^{-1} \quad (28)$$

In particular, the large Vandermonde matrix $V_{30}$ may be written in terms of smaller sub-matrices:

$$V_{30} = \begin{bmatrix} V_{16} & V_{16\times14} \\ V_{14\times16} & V_{14} \end{bmatrix} \quad (29)$$

Besides the Lagrange/Vandermonde matrices, the partial syndrome vector v is another crucial factor to the determination of the parity check symbols. To support RS(528,514), a small partial syndrome vector $v_{14}$ (e.g., [$v_{13}$, $v_{12}$, $v_{11}$, . . . $v_0$]) may be generated. To support RS(544,514), a large partial syndrome vector $u_{30}$ (e.g., [$u_{29}$, $u_{28}$, $u_{27}$, . . . $u_0$]) may be generated.

It might also be desirable to write the large partial syndrome vector $u_{30}$ in two parts:

$$u_{30}=[u_{16} u_{14}] \quad (30)$$

As shown in equation 30, vector $u_{16}$ may represent the upper 16 partial syndrome values [$u_{29}$, $u_{28}$, . . . $u_{14}$], whereas vector $u_{14}$ represents the lower 14 partial syndromes [$u_{13}$, $u_{12}$, . . . $u_0$]. We are using different letters for the syndromes for the two different codes (v for the small code, u for the large code) to emphasize the fact that $u_{14}$ and $v_{14}$ are different.

The small code word $p_{small}$ can therefore be computed by multiplying the small partial syndrome vector by the small Lagrange matrix, where $p_{small}$ is a vector containing the 14 parity symbols.

$$p_{small}=v_{14}*L_{small} \quad (31)$$

$$p_{large}=v_{30}*L_{large} \quad (32)$$

It may also be convenient to define $q_{14}$:

$$q_{14}=u_{14}*L_{small} \quad (33)$$

In accordance with some embodiments, the large code word $p_{large}$ can be generated by reusing the multiplication of $L_{small}$ and also as a function of $q_{14}$. To accomplish this, the smaller Lagrange matrix may be extended to the larger matrix size. For example, the extended small Lagrange matrix may be padded with zeroes as follows:

$$L^e_{small} = \begin{bmatrix} 0 & 0 \\ 0 & L_{small} \end{bmatrix} \quad (34)$$

For example, in a scenario where $L_{small}$ is a 14-by-14 Lagrange matrix, the top left zero may represent a 16×16 array of zeroes, the top right zero may represent a 16×14 array of zeroes, and the bottom left zero may represent a 14×16 array of zeroes.

As described above, it may be desirable to compute $p_{large}$ (i.e., the parity check symbols for the larger code word) using the matrix $L_{small}$. We define:

$$q_{30} = u_{30} * L_{small}^e \qquad (35)$$

We can then rewrite equation 35 using equations 30, 34 and 33 to express $q_{30}$ in terms of $q_{14}$:

$$\begin{aligned} q_{30} &= u_{30} * L_{small}^e \\ &= [u_{16} \ u_{14}] * \begin{bmatrix} 0 & 0 \\ 0 & L_{small} \end{bmatrix} \\ &= [0 \ q_{14}] \end{aligned} \qquad (36)$$

Continuing from equation 32, vector $p_{large}$ may be expressed as a function of $q_{14}$ as follows:

$$p_{large} = u_{30} * L_{large} = u_{30} * L_{large} + q_{30} + q_{30} \qquad (37)$$

This equation is valid because in the finite field, B plus B is equal to zero (i.e., two identical values added together will yield z zero using Galois field arithmetic).

Assuming a given matrix A multiplied by its inverse $A^{-1}$ is equal to the identity matrix I (i.e., a matrix with a diagonal of ones at only indices (0,0), (1,1), (2,2), etc.), the bolded portion of equation 37 can be rewritten as:

$$\begin{aligned} u_{30} * L_{large} + q_{30} &= u_{30} * L_{large} + q_{30} * (V_{30} * L_{large}) = (u_{30} + q_{30} * V_{30}) * L_{large} = (u_{30} + u_{30} * L_{small}^e * V_{30}) * L_{large} = u_{30} * (I + L_{small}^e * V_{30}) * L_{large} \end{aligned} \qquad (38)$$

By combining equations 29 and 34, the bolded portion of equation 38 can then be rewritten as:

$$L_{small}^e * V_{30} = \begin{bmatrix} 0 & 0 \\ 0 & L_{small} \end{bmatrix} \begin{bmatrix} V_{16 \times 16} & V_{16 \times 14} \\ V_{14 \times 16} & V_{14} \end{bmatrix} = \begin{bmatrix} 0 & 0 \\ L_{small} * V_{14 \times 16} & I \end{bmatrix} \qquad (39)$$

Thus, plugging equation 39 into the parenthetical in equation 38 would yield:

$$I + L_{small}^e * V_{30} = \begin{bmatrix} I & 0 \\ L_{small} * V_{14 \times 16} & 0 \end{bmatrix} \qquad (40)$$

Equation 40 may then be plugged into equation 38:

$$\begin{aligned} u_{30} * L_{large} + q_{30} &= \\ u_{30} * (I + L_{small}^e * V_{30}) * L_{large} &= [u_{16} \ u_{14}] * \begin{bmatrix} I & 0 \\ L_{small} * V_{14 \times 16} & 0 \end{bmatrix} * \\ L_{large} &= [(u_{16} + u_{14} * L_{small} * V_{14 \times 16}) \ 0_{14}] * L_{large} \end{aligned} \qquad (41)$$

The 14 element zero vector allows $L_{large}$ to be simplified by keeping only the first 16 rows. This selected subset of $L_{large}$ may be referred to as $L_{large}^{top}$. This gives:

$$u_{30} * L_{large} + q_{30} = [u_{16} + u_{14} * L_{small} * V_{14 \times 16}] * L_{large}^{top} \qquad (42)$$

Plugging equations 42 and 36 back into equation 37, $p_{large}$ can finally be expressed in terms of $q_{14}$ as follows:

$$p_{large} = (u_{30} * L_{large} + q_{30}) q_{30} = [u_{16} + q_{14} * V_{14 \times 16}] * L_{large}^{top} + [0 q_{14}] \qquad (43)$$

As mentioned above, the vectors $u_{14}$ and $v_{14}$ are different. They are, however, related by the equation:

$$u_{14} = u_{14} * D \qquad (44)$$

where D is the diagonal matrix that has the effect of multiplying $v_{14}$ (i) by $\alpha^{16i}$ i.e.

$$D = \begin{bmatrix} \alpha^{16 \times 13} & & & 0 \\ & \ddots & & \\ & & \alpha^{16i} & \\ & & & \ddots \\ 0 & & & & \alpha^0 \end{bmatrix} \qquad (45)$$

It might also be desirable to write the large partial syndrome vector $u_{30}$ as a function of the small partial syndrome vector $v_{14}$, combining equations 30 and 44:

$$u_{30} = [u_{16}(v_{14} * D)] \qquad (46)$$

Figure 3:
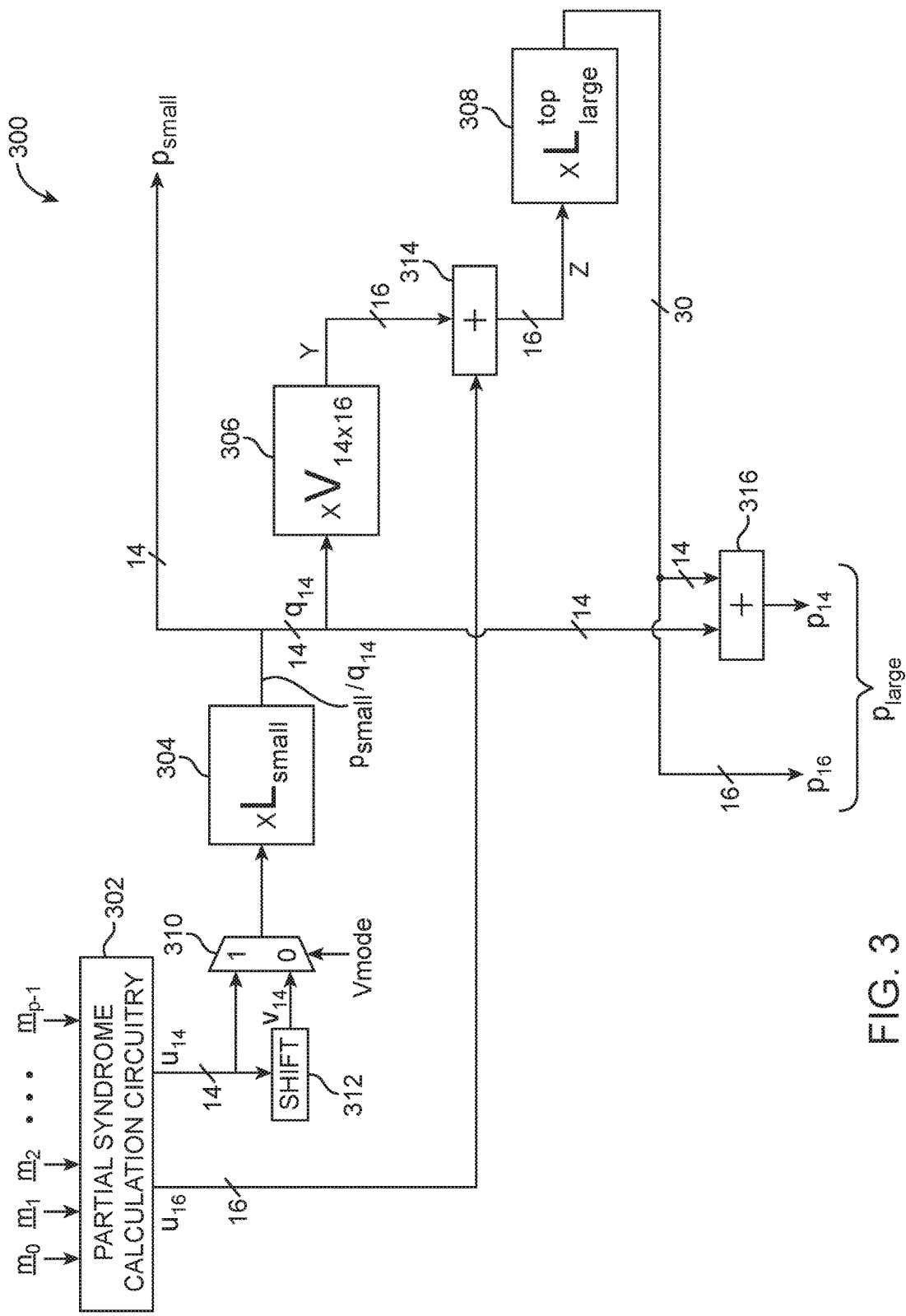
FIG. 3 is a diagram of one suitable implementation of a variable Reed-Solomon encoder circuit in accordance with an embodiment.

FIG. 3 is a diagram of one suitable implementation of a variable Reed-Solomon encoder circuit 300 in accordance with an embodiment. The circuitry of FIG. 3 is configured to effectively implement the arithmetic of equation 43. As shown in FIG. 3, encoder circuit 300 may include partial syndrome calculation circuitry 302, a first matrix multiplication circuit 304, a second matrix multiplication circuit 306, a third matrix multiplication circuit 308, a first addition circuit 314, and a second addition circuit 316. Partial syndrome calculation circuitry 302 may be configured to calculate the partial syndrome values v (e.g., by computing $m * S_u$). For example, partial syndrome calculation circuitry 302 may receive p message symbols $m_0, m_1, m_2, \ldots, m_{p-1}$ in parallel, where p has a value less than k. For example, if k is equal to 240 and p is equal to 24, it would take ten clock cycles (240 divided by 24) for partial syndrome calculation circuitry 302 of finish computing the partial syndrome values.

Partial syndrome calculating circuitry 302 may output vector u split into two parts: (1) a lower portion $u_{14}$ with the first 14 symbols and (2) an upper portion $u_{16}$ with the remaining 16 symbols. For small code word generation, partial syndrome values $v_{14}$ may be selectively provided to first matrix multiplication circuit 304. In response to receiving symbols $v_{24}$, circuit 304 may multiply $v_{24}$ by Lagrange matrix $L_{small}$ to generate small parity vector $p_{small}$ (e.g., a 14-symbol vector in this example). For large code word generation, partial syndromes values $u_{14}$ may be selectively provided to first matrix multiplication circuit 304. In response to receiving symbols $u_{14}$, circuit 304 may multiply $u_{14}$ by Lagrange matrix $L_{small}$ to generate the vector $q_{14}$. In other words, the output of circuit 304 can either be the parity symbols $p_{small}$ for the smaller code word or symbols $q_{14}$, which can be used as part of the calculation of the larger code word. Thus, matrix multiplication circuit 304 may serve as a smaller Reed-Solomon encoder sub-circuit within the larger encoder 300 that generates parity check symbols $p_{small}$ for the small code word mode and the vector $q_{14}$ for the large code word mode.

Vector $q_{14}$ may be fed to second matrix multiplication circuit 306. In response to receiving vector $q_{14}$, second matrix multiplication circuit 306 may multiply $q_{14}$ by Vandermonde matrix $V_{14 \times 16}$ to generate a corresponding product vector Y (e.g., a 16-symbol vector in this example).

First addition circuit 314 may have a first input that receives upper partial syndrome values $u_{16}$, a second input that receives product vector Y from the output of matrix multiplication circuit 306, and an output on which a corresponding sum vector Z (e.g., also a 16-symbol vector) is provided. Sum vector Z may be received at third matrix multiplication circuit 308, which multiplies sum vector Z by partial Lagrange matrix $L_{large}^{top}$ to produce a large symbol vector (e.g., a 30-symbol vector in this example).

The upper 16 symbols of the large symbol vector generated at the output of circuit 308 may serve directly as the upper 16 symbols ($p_{16}$) of large parity check symbol vector $p_{large}$. The lower 14 symbols of the large symbol vector generated at the output of circuit 308 may be combined directly with $q_{14}$ using second addition circuit 316 to generate the lower 14 symbols (pin) of final output vector $p_{large}$ (e.g., adder 316 may have a first input that receives 14 symbols from circuit 308 and a second input that receives $q_{14}$ from circuit 304). For the small (14-symbol) Reed-Solomon code word, only $p_{14}$ will be used. For the large (30-symbol) Reed-Solomon code word, the entire $p_{large}$ (including both $p_{16}$ and pin) will be used. This particular implementation does not require any zero extension, since the lower symbols are separately handled using addition circuit 316 while the upper 16 symbols are directly passed through to the output.

As described above, the exemplary variable Reed-Solomon encoder 300 of FIG. 3 may be configured to support a small 14-symbol code word and a large 30-symbol code word. This is merely illustrative. If desired, encoder 300 may be configured to support any number of code words with any suitable parity check symbol length.

Still referring to FIG. 3, the small and large code words that are supported will have difference syndromes for the first 14 symbols, even if the k message symbols are identical. In other words, the bottom entries of $u_{30}$ (i.e. $u_{14}$) may not be equal to $v_{14}$. Note that in this case, k is the same for both code words. In other cases, k may be different between code words, but in any case, the lower symbols should be shifted over the finite field.

To account for the differences between the lower elements of $u_{30}$ and $v_{14}$, a variable shift may be included within one or more paths in encoder circuit 300 (e.g., to implement the shifting of diagonal matrix in equation 44). A first option is to generate $u_{30}$ in syndrome generator 302 and then shift the least significant (LS) entries downwards to obtain $v_{14}$ for the small code. A second option is to generate $v_{14}$ plus the upper 16 elements of $u_{30}$ in syndrome generator 302. In this case, a subsequent upwards shift may be required to obtain the LS entries of $u_{30}$ for the large code. Yet another option involves integrating the variable shift into the syndrome generator 302, so that is generates the appropriate $u_{30}$ or $v_{14}$.

The example of FIG. 3 shows one way of implementing either the first or second option above, where vector $u_{14}$ may be selectively shifted using shifting circuit 312. Multiplexer 310 may have a first (1) input that receives the un-shifted vector $u_{14}$, a second (0) input that receives the shifted vector $v_{14}$, a control input that receives mode control signal Vmode, and an output. If control signal Vmode is asserted (e.g., at logic "1"), multiplexer 310 may be configured to route the un-shifted vector $u_{14}$ presented at its first input to its output. If control signal Vmode is deasserted (e.g., at logic "0"), multiplexer 310 may be configured to route the shifted vector $v_{14}$ presented at its second input to its output. Depending on the direction of the shifts in circuit 312, the shift values can either be applied when calculating the small code word parity symbols, or the partial computation of the larger code word parity symbols. Control signal Vmode may be deasserted for the long code word to pass through the pre-shifted vector or may be asserted for the small code word to pass through the un-shifted vector, or vice versa.

Moreover, a similar shifting mechanism may also be implemented at matrix multiplication 306 and 308. To account for the use of pseudo-syndromes rather than real syndromes, a negative 30-place shift may be placed at the output of circuit 306, and a positive 30-place shift may be placed at the input of circuit 308. These shifts may be absorbed into the corresponding matrix entries of $V_{14\times 16}$ and $L_{large}^{top}$.

Figure 4:
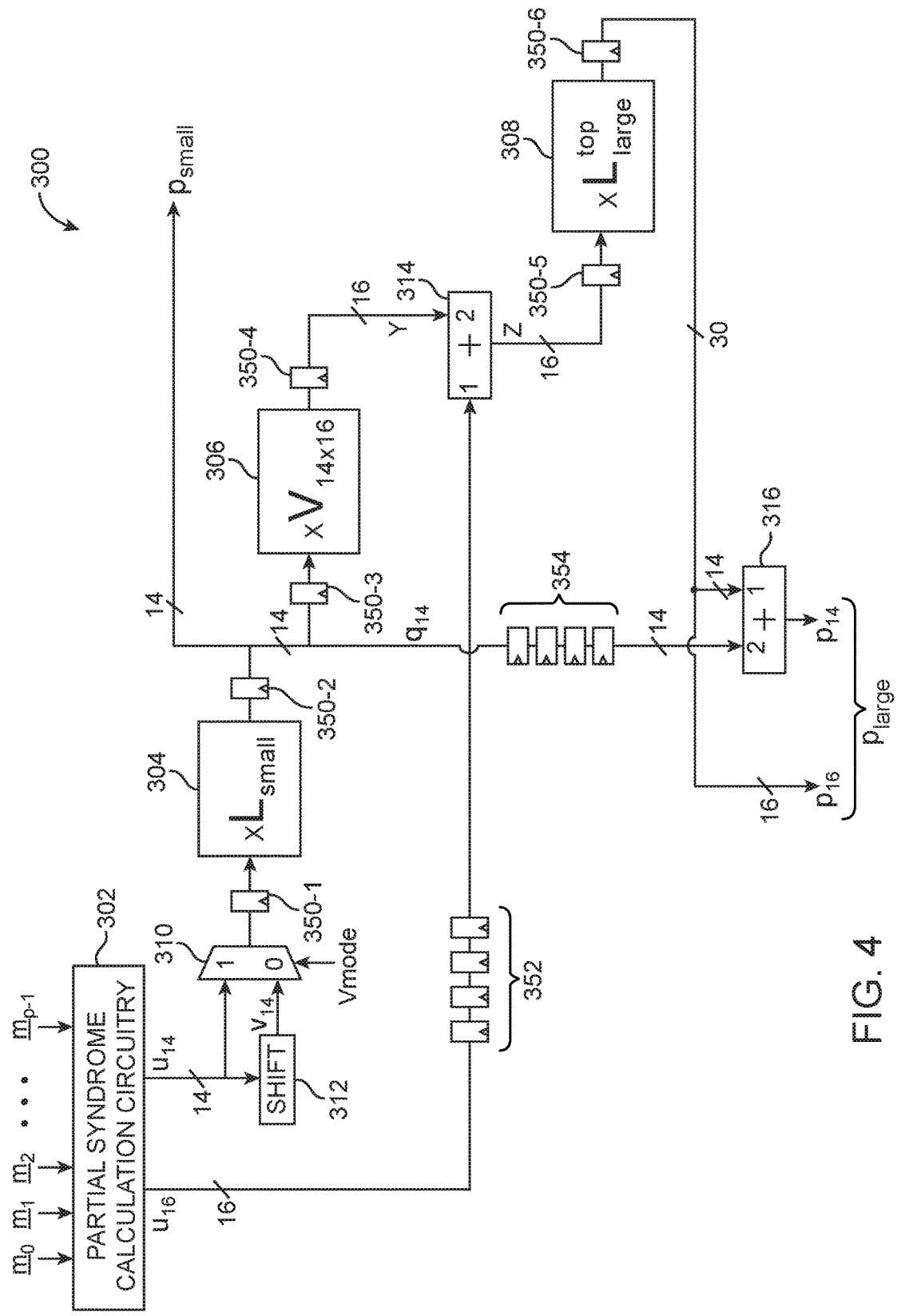
FIG. 4 is a diagram of another suitable implementation of a variable Reed-Solomon encoder circuit with additional pipeline registers in accordance with an embodiment.

FIG. 4 is a diagram of another suitable implementation of a variable Reed-Solomon encoder circuit with additional pipeline registers in accordance with an embodiment. As shown in FIG. 4, additional pipeline registers may be placed at the input and output of each matrix multiplication circuit. For example, pipeline registers 350-1 and 350-2 may be inserted at the input and output terminals of first matrix multiplication circuit 304, respectively. Similarly, pipeline registers 350-3 and 350-4 may be inserted at the input and output of second matrix multiplication circuit 306, respectively. Likewise, pipeline registers 350-5 and 350-6 may be inserted at the input and output of third matrix multiplication circuit 308, respectively.

Since two additional pipeline registers are added to each matrix multiply circuit, some extra pipeline registers may also need to be inserted to help synchronize the data received at adders 314 and 316. For example, four extra pipeline registers 352 may be inserted at the first input of addition circuit 314 to delay $v_{16}$ by four clock cycles. In other words, the four pipeline registers 352 may be used to help match the latency of registers 350-1, 350-2, 350-3, and 350-4 in the upstream path of the second input of adder 314. Similarly, four extra pipeline registers 354 may be inserted at the second input of addition circuit 316 to delay $p_{small}$ by four clock cycles. In other words, the four pipeline registers 354 may be used to help match the latency of registers 350-3, 350-4, 350-5, and 350-6 in the upstream path of the first input of adder 316. The insertion of pipeline registers can help optimize throughout of variable Reed-Solomon encoder 300.

Figure 5:
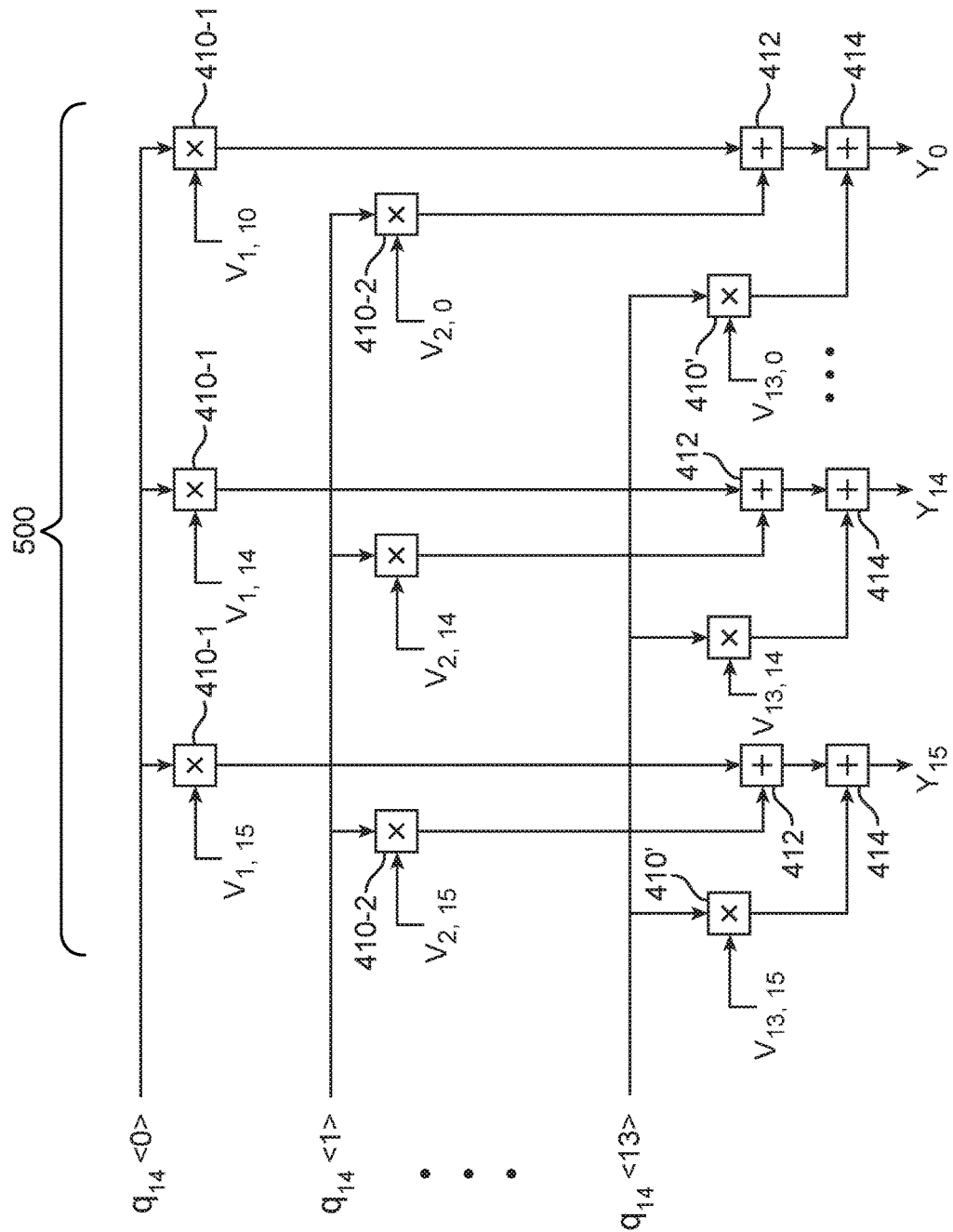
FIG. 5 is a diagram of an illustrative matrix multiplication circuit that can be included within a variable Reed-Solomon encoder circuit of the type shown in FIGS. 3 and 4 in accordance with an embodiment.

FIG. 5 is a diagram of an illustrative matrix multiplication circuit that can be included within a variable Reed-Solomon encoder circuit of the type shown in FIGS. 3 and 4 in accordance with an embodiment. In particular, matrix multiplication circuit 500 of FIG. 5 may serve as the second matrix multiplication circuit 306 of FIGS. 3 and 4, which is configured to multiply vector $q_{14}$ by Vandermonde matrix $V_{14\times 16}$.

As shown in FIG. 5, matrix multiplication circuit 500 may receive the 14-symbol small parity vector $q_{14}<13:0>$ generated from circuit 304 and is configured to calculate the symbols of product vector Y simultaneously in one clock cycle. Matrix multiplication circuit 500 may take each of the received parity check symbols and multiply them by all the terms in each Vandermonde polynomial. Each product can then be summed with all of the other products of the same coefficient index for each polynomial (e.g., all the $X_{15}$ products can be added together to produce symbol $Y_{15}$, all the $X^{14}$ products can be added together to produce $Y_{14}$, all the $X^{13}$ products can be added together to produce $Y_{13}$, etc.).

For example, for symbol $Y_{15}$: $q_{14}<0>$ is multiplied by the 16th coefficient $V_{1,15}$ in the first Lagrangian polynomial using constant GF( ) multiplier 410-1; $q_{14}<1>$ is multiplied by the 16th coefficient $V_{2,16}$ in the second polynomial using constant GF( ) multiplier 410-2; and $q_{14}<13>$ is multiplied by the 16th coefficient $V_{13,15}$ in the last polynomial using constant GF( ) multiplier 410'.

Similarly, for symbol $Y_0$: $q_{14}<0>$ is multiplied by the constant $V_{1,0}$ in the first Lagrangian polynomial using constant GF( ) multiplier 410-1; $q_{14}<1>$ is multiplied by constant $V_{2,0}$ in the second polynomial using constant GF( ) multiplier 410-2; and $q_{14}<13>$ is multiplied by constant $V_{13,0}$ in the last polynomial using constant GF( ) multiplier 410'.

Note that constant GF( ) multipliers 410 can be used since all Lagrangian coefficients are constant and can be precomputed in advance. The predetermined Lagrangian coefficients may be held locally in storage circuits 296 or 298 (see, e.g., FIG. 2). Additional multipliers 410 associated with parity symbols $q_{14}<2>$ through $q_{14}<12>$ are not shown so as to not unnecessarily obscure the present embodiments. All of the products for each parity symbol are summed together using GF( ) adders 412 and 414. All intermediate symbols $Y_1$ through $Y_{13}$ can also be computed in this way using constant GF( ) multipliers 410 and adders 412/414.

The example of FIG. 5 describing the second matrix multiplication circuit is merely illustrative. First matrix multiplication circuit 304 and third matrix multiplication circuit 308 (of FIG. 4) can be similarly implemented using an array of finite field multipliers and adders configured in the arrangement of FIG. 5.

Figure 6:
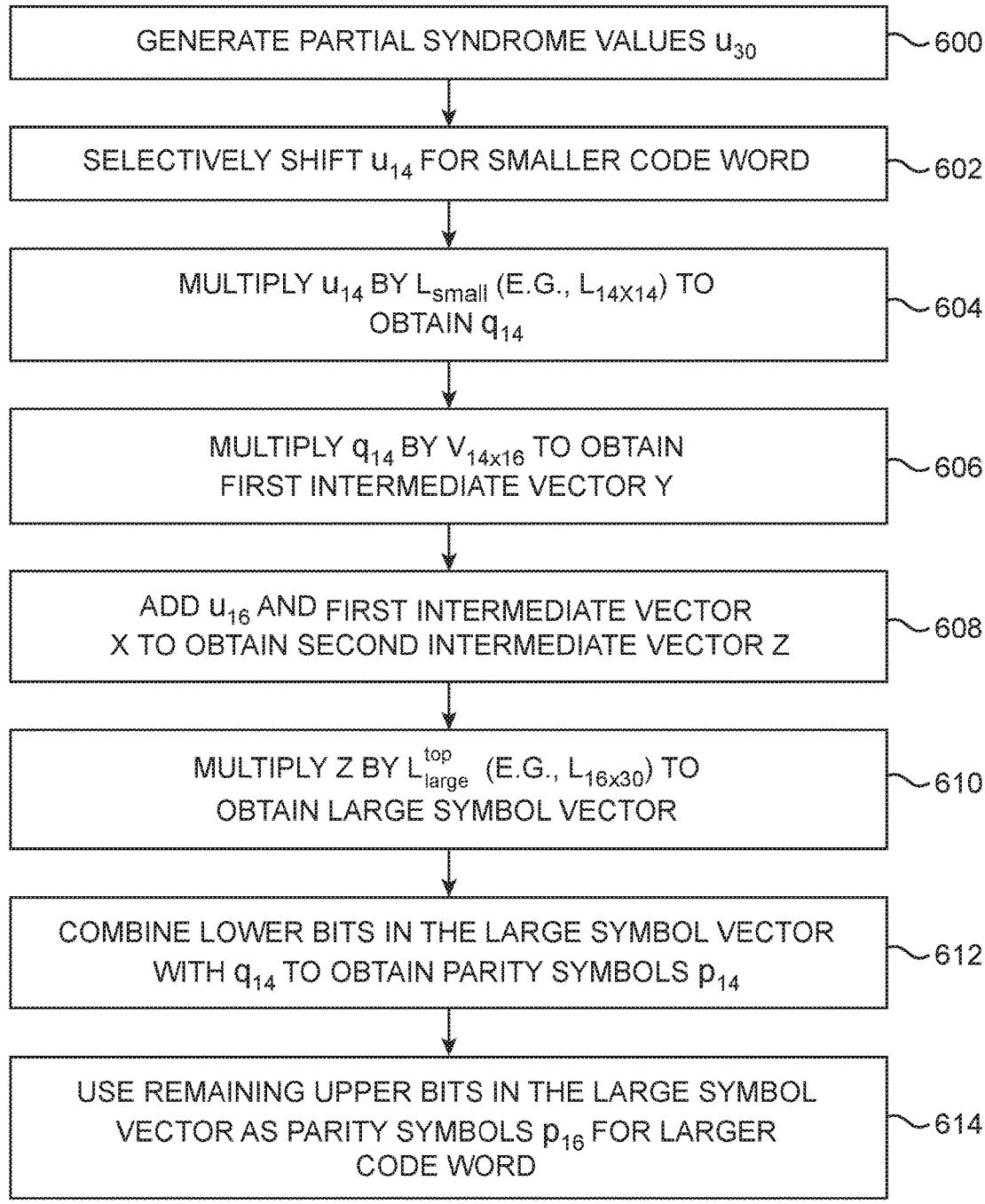
FIG. 6 is a flow chart of illustrative steps for operating a variable Reed-Solomon encoder circuit in accordance with an embodiment.

FIG. 6 is a flow chart of illustrative steps for operating variable Reed-Solomon encoder circuit 300 of FIG. 3 or 4 in accordance with an embodiment. Encoder circuit 300 may be operable in at least a first mode that supports a smaller code word and a second mode that supports a larger code word. At step 600, the partial syndrome calculating circuitry may be used to generate partial syndrome values $u_{30}$. At step 602, partial syndrome vector $u_{14}$ may be selectively shifted for the smaller code word (e.g., using multiplexer 310 to pass through the shifted vector $v_{14}$). The unshifted vector $u_{14}$ may be passed through for the larger code word.

At step 604, first matrix multiplication circuit 304 may be used to multiply either $u_{14}$ or $v_{14}$ by $L_{small}$ (e.g., $L_{14 \times 14}$) to obtain small parity vector $q_{14}$ or $p_{small}$. For the small code word, $p_{small}$ may be simply used at the output. For the large code word, second matrix multiplication circuit 306 may be used to multiply vector $q_{14}$ by Vandermonde matrix $V_{14 \times 16}$ to obtain first intermediate product vector Y (step 606). At step 608, adder 314 may be used to add upper partial syndromes $u_{16}$ to 16-symbol product vector Y to yield a second intermediate sum vector Z.

At step 610, third matrix multiplication circuit 308 may be used to multiply sum vector Z by Lagrange matrix $L_{large}^{top}$ (e.g., matrix $L_{16 \times 30}$) to produce a corresponding large symbol vector. At step 612, the lower 14 symbols of the large symbol vector may be combined with small parity vector $q_{14}$ using adder 316 to generate parity check symbols $p_{14}$. at step 614, the remaining upper symbols in the large symbol vector may serve directly as parity symbols $p_{16}$ for only the larger code word.

The steps of FIG. 6 for computing parity check symbols for two different code words using multiple stages of matrix multiplication are merely illustrative. In general, the parity symbols for two or more Reed-Solomon code words may be computed using any suitable number of separate matrix multiplication circuits. Computing parity check symbols in this way enables designers to build Reed-Solomon encoders to support a variety of code words, by allowing a smaller Reed-Solomon code to be processed by the same hardware as a larger Reed-Solomon code, as long as the Galois fields are the same. In other words, only one encoding circuit is needed to handle multiple Reed-Solomon codes.

The foregoing is merely illustrative of the principles of this invention and various modifications can be made by those skilled in the art. The foregoing embodiments may be implemented individually or in any combination.

What is claimed is:

1. An integrated circuit, comprising:
   a Reed-Solomon encoder operable in a first mode to output code words with a first number of symbols and in a second mode to output code words with a second number of symbols that is different than the first number of symbols, wherein the Reed-Solomon encoder includes a Reed-Solomon encoder sub-circuit that generates parity check symbols to be used for obtaining the output code words with the first number of symbols during the first mode and for obtaining the output code words with the second number of symbols during the second mode.

2. The integrated circuit of claim 1, wherein the Reed-Solomon encoder further comprises:
   partial syndrome calculation circuitry that generates a partial syndrome vector, wherein the parity check symbols are generated from the partial syndrome vector.

3. The integrated circuit of claim 2, wherein the Reed-Solomon encoder sub-circuit further comprises:
   a first matrix multiplication circuit that receives only a lower portion of the partial syndrome vector from the partial syndrome calculation circuitry and that multiplies the lower portion of the partial syndrome vector by a Lagrange matrix to generate the parity check symbols, wherein the parity check symbols represent a small parity symbol vector.

4. The integrated circuit of claim 3, wherein the Reed-Solomon encoder further comprises:
   a second matrix multiplication circuit that receives the small parity symbol vector from the first matrix multiplication circuit and that multiplies the small parity symbol vector by a Vandermonde matrix to produce a corresponding product vector.

5. The integrated circuit of claim 4, wherein the Reed-Solomon encoder further comprises:
   an adder circuit that combines the product vector output from the second matrix multiplication circuit with an upper portion of the partial syndrome vector to generate a corresponding sum vector.

6. The integrated circuit of claim 5, wherein the Reed-Solomon encoder further comprises:
   a third matrix multiplication circuit that receives the sum vector from the adder circuit and that multiplies the sum vector by an additional Lagrange matrix that is larger than the Lagrange matrix associated with the first multiplication circuit to produce an output vector.

7. The integrated circuit of claim 6, wherein the Reed-Solomon encoder further comprises:
   an additional adder circuit that combines a lower portion of the output vector with the small parity symbol vector to generate first parity check symbols that are different than the parity check symbols generated by the first matrix multiplication circuit.

8. The integrated circuit of claim 7, wherein the upper portion of the output vector serves as second parity check symbols, wherein only the first parity check symbols are used during the first mode to obtain the code words with the first number of symbols, and wherein the first and second parity check symbols are used during the second mode to obtain the code words with the second number of symbols.

9. A method of operating a Reed-Solomon encoder, comprising:
 receiving message symbols;
 in response to receiving the message symbols, using partial syndrome calculation circuitry to generate a partial syndrome vector; and
 with a first matrix multiplication circuit, receiving only a lower portion of the partial syndrome vector and multiplying the received lower portion of the partial syndrome vector by a Lagrange matrix to produce a small parity symbol vector.

10. The method of claim 9, further comprising:
 with a second matrix multiplication circuit, receiving the small parity symbol vector and multiplying the small parity symbol vector by a Vandermonde matrix to produce a corresponding product vector.

11. The method of claim 10, further comprising:
 with a first addition circuit, combining the product vector with only an upper portion of the partial syndrome vector to produce a corresponding sum vector.

12. The method of claim 11, further comprising:
 with a third matrix multiplication circuit, receiving the sum vector and multiplying the sum vector by another Lagrange matrix that is larger than the Lagrange matrix associated with the first matrix multiplication circuit to produce an output vector.

13. The method of claim 12, further comprising:
 with a second addition circuit, combining only a lower portion of the output vector with the small parity symbol vector to produce a small code word.

14. The method of claim 13, further comprising:
 outputting an upper portion of the output vector and the small code word collectively as a large code word.

15. The method of claim 12, further comprising:
 pipelining at least some of the first, second, and third matrix multiplication circuits.

16. Reed-Solomon encoder circuitry, comprising:
 partial syndrome calculation circuitry that receives message symbols and that generates a partial syndrome vector; and
 a plurality of matrix multiplication circuits connected in a chain, wherein a first portion of the plurality of matrix multiplication circuits computes parity check symbols for a small code word using a lower portion of the partial syndrome vector, and wherein a second portion of the plurality of matrix multiplication circuits computes parity check symbols for a large code word using the partial syndrome vector.

17. The Reed-Solomon encoder circuitry of claim 16, wherein the first portion of the plurality of matrix multiplication circuits includes a first matrix multiplication circuit that multiplies the lower portion of the partial syndrome vector by a small Lagrange matrix to generate a corresponding product vector.

18. The Reed-Solomon encoder circuitry of claim 17, wherein the second portion of the plurality of matrix multiplication circuits comprises:
 a second matrix multiplication circuit that multiplies the product vector by a Vandermonde matrix to generate an additional product vector; and
 a third matrix multiplication circuit that multiplies a sum vector computed using an upper portion of the partial syndrome vector and the additional product vector by a large Lagrange matrix that is bigger than the small Lagrange matrix to generate the parity check symbols for the large code word.

19. The Reed-Solomon encoder circuitry of claim 18, wherein the first, second, and third matrix multiplication circuits each have an input and an output, the Reed-Solomon encoder further comprising:
 a pipeline register coupled to the input or output of at least one of the first, second, and third matrix multiplication circuits.

20. The Reed-Solomon encoder circuitry of claim 18, further comprising:
 shifting circuitry associated with at least a selected one of the first, second, and third matrix multiplication circuits.

* * * * *